(12) United States Patent
Takao et al.

(10) Patent No.: US 8,490,931 B2
(45) Date of Patent: Jul. 23, 2013

(54) DISPLAY APPARATUS

(75) Inventors: Mitsuyoshi Takao, Hidaka (JP);
Takayoshi Tomioka, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 68 days.

(21) Appl. No.: 12/611,815

(22) Filed: Nov. 3, 2009

(65) Prior Publication Data

US 2010/0193648 A1    Aug. 5, 2010

(30) Foreign Application Priority Data

Jan. 30, 2009   (JP) ................... 2009-020391

(51) Int. Cl.
*F16M 11/00*    (2006.01)
(52) U.S. Cl.
USPC ............. 248/163.1; 248/440.1; 248/440; 248/188.8; 248/346.01; 248/917; 361/679.21; 108/150; 312/7.2; 348/825
(58) Field of Classification Search
USPC ............. 248/163.1, 164, 432, 440.1, 440, 248/176.1, 188.8, 917, 688, 677, 676, 121, 248/127, 128, 146, 158, 220.21, 220.22, 248/309.1, 346.01, 346.03, 918, 919, 920, 248/921, 923; 361/679.02, 679.21, 679.01, 361/679.23, 679.27, 679.29, 679.04, 679.05, 361/679.06, 681; 348/739, 731, 825, 826; 345/825, 826, 582; 108/150; 312/7.2; 225/93, 225/96.5
See application file for complete search history.

(56) References Cited

U.S. PATENT DOCUMENTS

| | | | | |
|---|---|---|---|---|
| 6,967,668 | B2 * | 11/2005 | Byoun et al. ..................... 345/55 |
| 7,287,729 | B2 * | 10/2007 | Jung et al. .................. 248/122.1 |
| 7,489,500 | B2 | 2/2009 | Liou et al. |
| 7,604,206 | B2 | 10/2009 | Jung et al. |
| 7,631,843 | B2 * | 12/2009 | Makino ...................... 248/176.1 |
| 7,684,175 | B2 * | 3/2010 | Takao ...................... 361/679.01 |
| 7,733,645 | B2 * | 6/2010 | Hsu .......................... 361/679.59 |
| 7,907,391 | B2 * | 3/2011 | Park et al. ................ 361/679.21 |
| 2003/0103092 | A1 * | 6/2003 | Byoun et al. ................... 345/866 |
| 2006/0087596 | A1 * | 4/2006 | Park et al. ..................... 348/739 |
| 2006/0208145 | A1 * | 9/2006 | Chen ......................... 248/289.11 |
| 2007/0216702 | A1 * | 9/2007 | Takahashi et al. ............ 345/582 |
| 2008/0023601 | A1 * | 1/2008 | Kuan et al. ................. 248/176.1 |
| 2011/0073738 | A1 * | 3/2011 | Takao ........................... 248/397 |

FOREIGN PATENT DOCUMENTS

| | | |
|---|---|---|
| JP | 10145052 | 5/1998 |
| JP | 2001-118522 | 4/2001 |
| JP | 2001-347895 | 12/2001 |
| JP | 2003061010 | 2/2003 |
| JP | 2003280533 | 10/2003 |

(Continued)

OTHER PUBLICATIONS

Japanese Patent Application No. 2009-020391, Notice of Reasons for Refusal, mailed Jul. 6, 2010, (with English Translation).

(Continued)

*Primary Examiner* — Todd M. Epps
(74) *Attorney, Agent, or Firm* — Blakely, Sokoloff, Taylor & Zafman LLP

(57) ABSTRACT

A display apparatus including: a body having a display panel, and a chassis placed on a back of the display panel; and a stand having a plurality of support members that support the body by coupling to the body. At least one of the plurality of support members is different in strength from the other.

8 Claims, 10 Drawing Sheets

FOREIGN PATENT DOCUMENTS

| | | |
|---|---|---|
| JP | 2004126456 | 4/2004 |
| JP | 2006-018083 | 1/2006 |
| JP | 2006-323084 | 11/2006 |
| JP | 2007310318 | 11/2007 |
| JP | 2008112122 | 5/2008 |
| JP | 2008292965 | 12/2008 |

OTHER PUBLICATIONS

Japanese Patent Application No. 2009-020391, Notice of Reasons for Refusal, mailed Mar. 2, 2010, (with English Translation).

\* cited by examiner

DISPLAY APPARATUS

CROSS-REFERENCE TO RELATED APPLICATIONS

The entire disclosure of Japanese Patent Application No. 2009-020391 filed on Jan. 30, 2009, including specification, claims, drawings and abstract is incorporated herein by reference in its entirety.

BACKGROUND

1. Field of the Invention

One aspect of the present invention relates to a display apparatus in which a body of the display apparatus is supported by a stand.

2. Description of the Related Art

Recently, thin television screens using a display panel such as a liquid crystal display panel or a Plasma Display Panel (PDP) are becoming larger in size, and many thin television receivers of 40 type (the effective visible area has a diagonal length of 40 inches) or larger have been commercialized. A thin television receiver has an external shape configured as a laterally elongated rectangular flat plate in which the aspect ratio of the screen is 16:9. For example, a television receiver of 46 type has a width of about 110 cm and a height of about 80 cm, and that of 52 type has a width of about 130 cm and a height of about 85 cm.

FIG. 13 is a perspective view showing the external shape of a related art display apparatus 100 such as a thin television receiver. A body 101 of the display apparatus is installed with a stand 102 attached thereto. The stand 102 is called an installation stand or a table stand, and supports the body of the display apparatus. The stand 102 includes a supporting portion for fixing the body 101. The body 101 and the supporting portion are fixed to each other by screws or the like.

The weight of the body of a display apparatus such as a thin television receiver is about 30 kg in the case of 46 type, and 40 kg in the case of 52 type. The supporting portion must support the weight. When a force is externally applied to the body in a direction toward which the body is tilted, a large force acts on the supporting portion. When a force which is larger than that is allowed by the supporting portion acts on the supporting portion, the supporting portion is deformed, and may be broken, then the body may be collapsed.

A structure which, when an impact force is applied on a monitor (display apparatus), absorbs the impact force, and which, even after the impact force is absorbed, prevents the monitor from dropping out has been invented (see JP-A-2001-347895, for instance). In the configuration disclosed in JP-A-2001-347895, a clip is disposed in a bracket attached to the monitor, and a grommet is disposed in a stationary support bracket. A bar portion which supports the inserted clip, and which is deformed when an impact force of a threshold or higher level is applied is disposed in the grommet. At a position therebelow, a movement allowable space which, when the bar portion is deformed, allows the clip to downward move by a certain distance, and a movement blocking portion which inhibits downward movement that is greater than the certain distance are disposed.

As an example of the case where an external force is applied to the display apparatus body in a direction toward which the body is tilted, a case will be considered where a person accidentally collides against an upper portion of the display apparatus. Alternatively, another case may be considered where a child carelessly puts hands on the body and hangs down from the body. When such an unexpected external or impact force acts on the upper portion of the display apparatus, an extremely large force is applied to the supporting portion of the stand, then the supporting portion may be broken.

FIG. 14 is a view of a state where the body 101 of the related art display apparatus 100 is collapsed, as viewed from the side. The figure shows how the supporting portion 103 of the stand 102 is broken and the body 101 is collapsed toward the front side (the side of the display panel) due to an external force F acted on the upper portion of the body 101.

If the deformation of the supporting portion 103 is within the plastic deformation range, breakage may not be caused. When brittle fracture occurs, however, the supporting portion is broken, and the body is collapsed. Since, in the case of 46 type or more, the body has a weight of 30 kg or more, the collapsing of the body is dangerous. Therefore, it is desired that, even when an external force which is larger than a threshold value is applied, a certain degree of deformation is allowed, however, collapsing does not occur.

BRIEF DESCRIPTION OF THE DRAWINGS

Embodiment may be described in detail with reference to the accompanying drawings, in which.

DETAILED DESCRIPTION OF THE EMBODIMENTS

Various embodiments according to the present invention will be described hereinafter with reference to the accompanying drawings. In general, according to one embodiment of the present invention, there is provided a display apparatus including: a body having a display panel, and a chassis placed on a back of the display panel; and a stand having a plurality of support members that support the body by coupling to the body, wherein at least one of the plurality of support members is different in strength from the other.

First Embodiment

Figure 1:
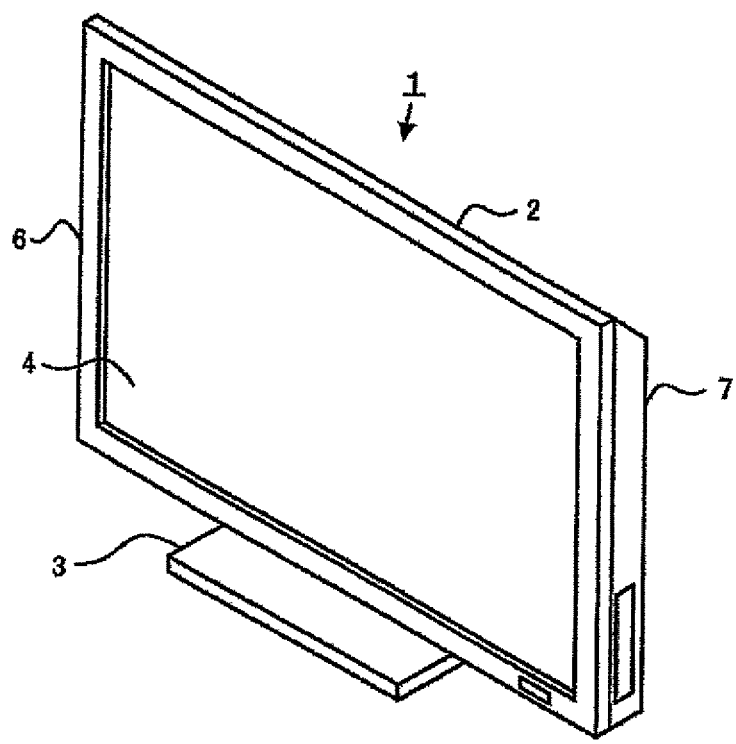
FIG. 1 is an exemplary perspective view schematically showing the display apparatus of the invention.

Hereinafter, an embodiment of the display apparatus of the invention will be described with reference to the drawings. FIG. 1 is a perspective view schematically showing the display apparatus 1 of the invention. The body 2 of the display apparatus 1 is attached to a stand 3 which supports the body of the display apparatus. The stand 3 includes support members to which the body 2 is to be fixed. The body and the support members are fixed to each other by screws or the like. A display panel 4 such as a liquid crystal display panel or a PDP is placed on the front of the body 2. The outer face is surrounded by: a front cover 6 which covers the front of the body 2 and parts of the upper face, lower face, and both sides of the body; a back cover 7 which covers the back of the body 2 and parts of the upper face, lower face, and both sides of the body.

Figure 2:
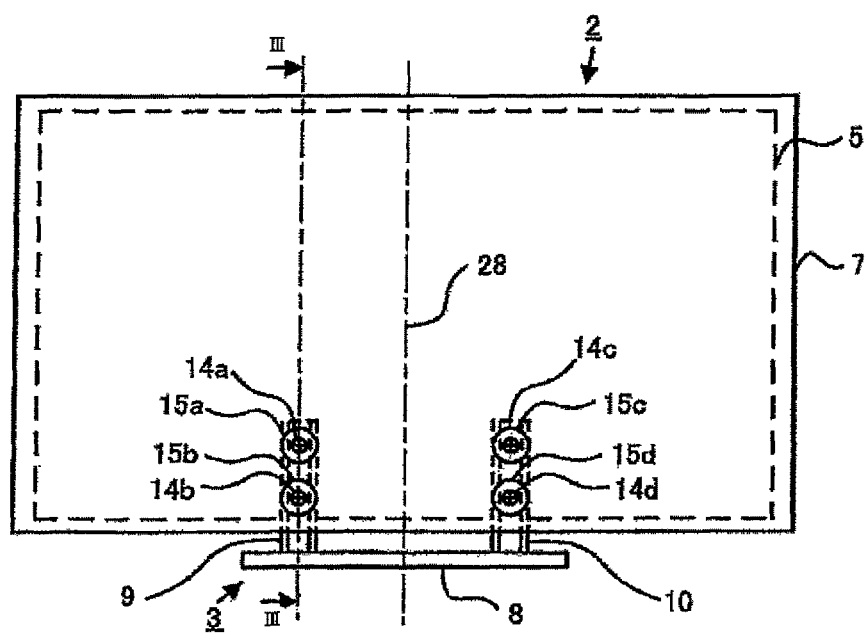
FIG. 2 is an exemplary view of the display apparatus, as viewed from the back.

FIG. 2 is a view of the display apparatus 1, as viewed from the back. A chassis 5 is placed inside the body 2. A lower and substantially middle portion of the chassis 5 is joined to the stand 3. The support members 9, 10 are substantially perpendicularly raised from a pedestal 8 of the stand 3. In each of the support members, two screw-fixing holes 11a, 11b or 12a, 12b are formed. Fixing screw holes which are not shown are disposed in the chassis 5. The chassis 5 and the stand 3 are fixed to each other by fixing screws 14a to 14d. In the chassis 5, joint portions between the chassis 5 and the support members 9, 10 are configured by a metal plate having a thickness of, for example, 2 mm. Although the four fixing screws are used in the embodiment, it is a matter of course that a plurality of fixing screws 14 may be added as required.

When, for the sake of weight reduction or the like, the metal sheet of the chassis is thinned or the chassis is made of a resin, the strength of the chassis is reduced. Therefore, a case may be possible where another frame (not shown) configured by a metal plate is attached to the back of the chassis and the support members 9, 10 of the stand 3 are coupled to the frame. The frame may have a size which is approximately identical to the chassis as viewed from the back, or may be disposed only in the vicinity of the joint portions with the support members 9, 10 of the stand 3.

In the back cover 7, openings 15a to 15d are formed at positions corresponding to the fixing screws 14a to 14d, so that the fixing screws 14a to 14d can be fastened or loosened from the outside of the back cover 7.

Figure 3:
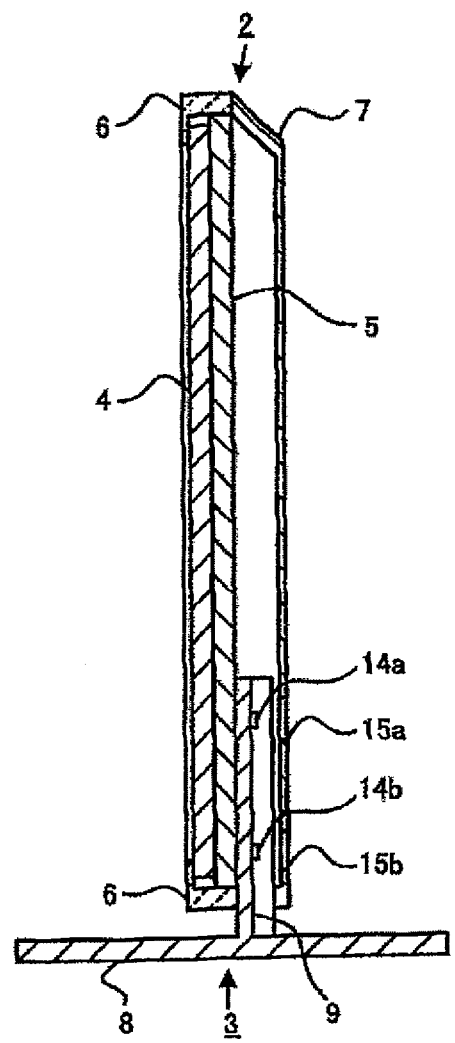
FIG. 3 is an exemplary view of the display apparatus showing an A-A section in FIG. 2.

FIG. 3 is a view of the display apparatus 1 showing a III-III section in FIG. 2. The display panel 4 such as a liquid crystal display panel or a PDP is placed on the front of the body 2, and the chassis 5 which supports the display panel 4 is placed on the back of the display panel 4. A circuit board and power supply circuit which are used for driving the display panel, and which are not shown are disposed on the back of the chassis 5. The front cover 6 and the back cover 7 are fixed to the chassis 5. The chassis 5 and the support members 9 which are substantially perpendicularly raised from the pedestal 8 of the stand 3 are fixed by the fixing screws 14a, 14b.

Figure 4:
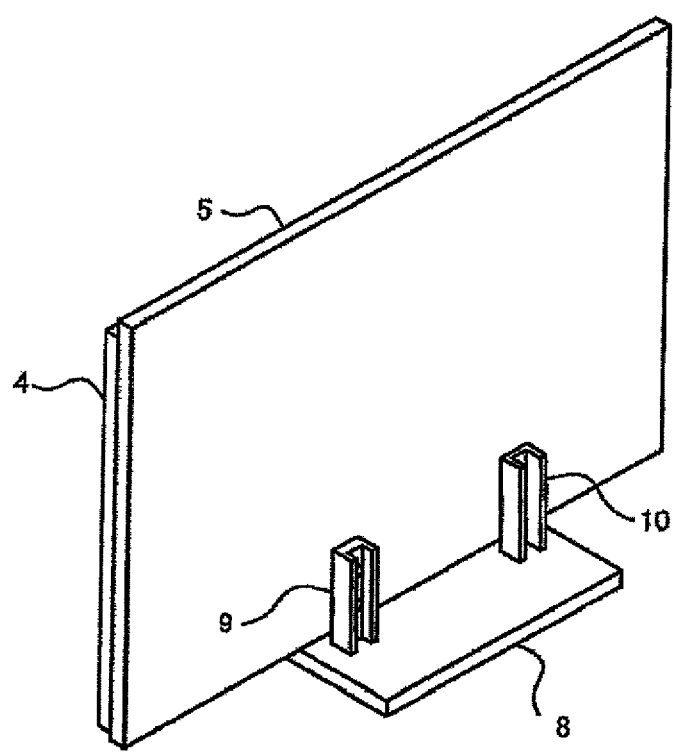
FIG. 4 is an exemplary perspective view of a state where a chassis is coupled to support members, as viewed from the back.

FIG. 4 is a perspective view of a state where the chassis 5 is coupled to the support members 9, 10, as viewed from the back. The figure shows a state where the front cover 6 and the back cover 7 are detached, as viewed from the back. The chassis 5 is supported by the support members 9, 10, and hence the support members 9, 10 support the weight of the body 2. When a force is externally applied to the body 2 in a direction toward which the body 2 is tilted, a large force acts on the support members 9, 10.

Figure 5:
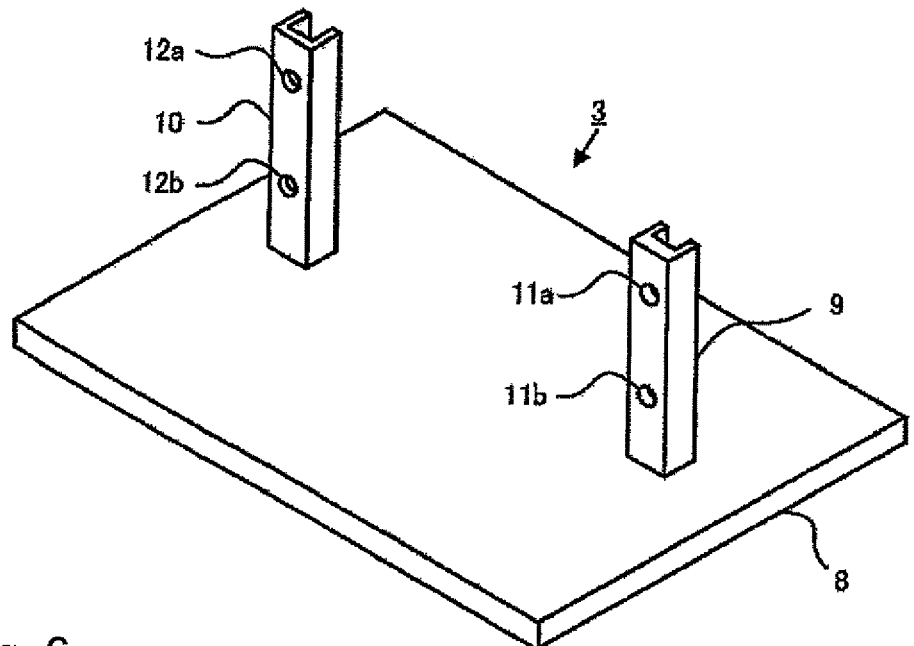
FIG. 5 is an exemplary perspective view schematically showing a stand.

FIG. 5 is a perspective view schematically showing the stand 3. The stand 3 is configured by the pedestal 8 and the support members 9, 10. In the pedestal 8, a planar portion for positioning the pedestal 8 with respect to the installation face is disposed in the lower face (the face which is to be contacted with the installation face). The support members 9, 10 are positioned above the pedestal 8, and disposed substantially perpendicularly to the planar portion. Particularly, the faces to which the chassis 5 is to be joined are substantially vertical. Each of the support members 9, 10 has the two screw-fixing holes 11a, 11b or 12a, 12b. The number of the screw-fixing holes may be adequately increased in accordance with that of required screws.

The pedestal 8 and the support members 9, 10 are integrated with one another, and may be integrally molded by the same material. Alternatively, they are produced by different materials, and thereafter firmly joined to one another. When they are integrally molded by the same material, aluminum die-casting or the like may be employed. The support members 9, 10 have different sectional shapes, and differ in strength against bending deformation from each other. In the support member 9, the partial dimensions of the section are larger than those of the corresponding portion of the support member 10. The support member 9 is partially thickened so that the strength is enhanced.

In the support members 9, 10, the strength against bending deformation or that to resist breakage is determined so that, when an external force which may be applied to the body is supposed, the support members withstand the supposed threshold external force. First, it is assumed that both of the support members are the support members 10 having the lower strength, and the dimensions of the support member 10 are determined so that the portions withstand the threshold external force. The threshold external force is determined depending on the specifications regarding the strength of the display apparatus 1. With respect to the support member 9, next, the dimensions are determined so that the strength exceeds that of the support member 10.

According to the configuration, when an external or impact force which exceeds the threshold external force acts on the body 2, the support member 10 having the lower strength is first deformed. When the support member 10 having the lower strength is largely deformed, the support member 10 is broken. When the support member 10 is first deformed or broken, the external or impact force is absorbed, and the support member 9 having the higher strength is not broken, so that it is possible to prevent the body 2 from being collapsed. At least the situation where the support members are simultaneously broken does not occur, and hence there is a large possibility that the body 2 can be prevented from being collapsed. When one side of the body is deformed, the time to reduce the external force is produced. For example, even when a person accidentally collides against an upper portion of the display apparatus, or when a child carelessly puts hands on the body and hangs down from the body, when one side of the body is deformed, the action of a continuous external force is reduced, and there is a large possibility that the body 2 can be prevented from being collapsed.

When an external force which is larger than the external force exceeding the threshold external force, such as an external force which is several or several tens of times the threshold external force continuously acts, however, it cannot be denied that also the support member having the higher strength has a possibility of being broken.

Figure 6:
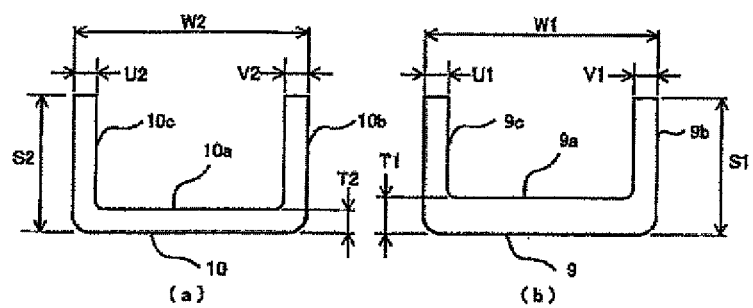
FIG. 6 is an exemplary view showing the sectional shapes of the support members.

FIG. 6 is a view showing the sectional shapes of the support members 9, 10. In FIG. 6, section (a) shows the sectional shape of the support member 10, and section (b) shows that of the support member 9. The support members 9, 10 have substantially U-like sectional shapes. The reference numerals S1, T1, U1, V1, and W1 indicate dimensions of the support member 9, and S2, T2, U2, V2, and W2 indicate dimensions of the support member 10, respectively.

As described above, S2, T2, U2, V2, and W2 determine the dimensions of the support member 10 so that the portion withstands the threshold external force. By contrast, S1, T1, U1, V1, and W1 determine the dimensions so that the strength of the support member 9 against bending deformation or to resist breakage is higher than that of the support member 10. In FIG. 6, S1 and S2, V1 and V2, and W1 and W2 are substantially equal to each other, respectively, and T1 is larger than T2. In the support member 9, T1 is increased so that a connecting portion 9a is thickened, thereby enhancing the strength of the support member.

Preferably, portions of the support members where their strengths are differentiated may be the weakest portions, or namely the strength difference may be formed between the portions which are most deformable. According to the configuration, the support member having the lower strength is first deformed, and the support member having the higher strength is not broken, so that it is possible to prevent the body 2 from being collapsed.

Second Embodiment

Figure 7:
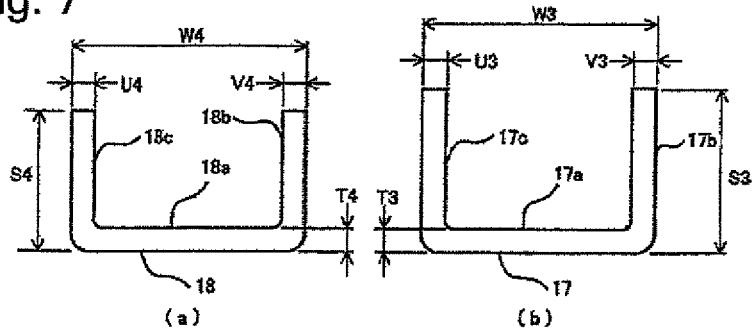
FIG. 7 is an exemplary view showing the sectional shapes of support members in a second embodiment.

FIG. 7 is a view showing the sectional shapes of support members in the second embodiment of the invention. The second embodiment is different from the first embodiment in that the second embodiment uses a support member 17 in place of the support member 9 in the first embodiment, and the second embodiment uses a support member 18 in place of the support member 10 in the first embodiment. In FIG. 7, section (a) shows the sectional shape of the support member 18, and section (b) shows that of the support member 17. The support members 17, 18 have substantially U-like sectional shapes. The reference numerals S3, T3, U3, V3, and W3 indicate dimensions of the support member 17, and S4, T4, U4, V4, and W4 indicate dimensions of the support member 18, respectively.

As described above, S4, T4, U4, V4, and W4 determine the dimensions of the support member 18 so that the portion withstands the threshold external force. By contrast, S3, T3, U3, V3, and W3 determine the dimensions so that the strength of the support member 17 becomes higher. In FIG. 7, T3 and T4, U3 and U4, V3 and V4, and W3 and W4 are substantially equal to each other, respectively, and S3 is larger than S4. In the support member 17, S3 is increased so that rib portions 17b, 17c are lengthened, thereby enhancing the strength of the support member.

Third Embodiment

Figure 8:
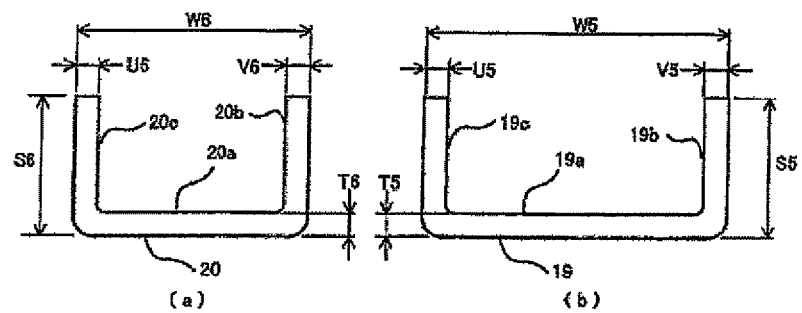
FIG. 8 is an exemplary view showing the sectional shapes of support members in a third embodiment.

FIG. 8 is a view showing the sectional shapes of support members in the third embodiment of the invention. The third embodiment is different from the first embodiment in that the third embodiment uses a support member 19 in place of the support member 9 in the first embodiment, and the third embodiment uses a support member 20 in place of the support member 10 in the first embodiment. In FIG. 8, section (a) shows the sectional shape of the support member 20, and section (b) shows that of the support member 19. The support members 19, 20 have substantially U-like sectional shapes. The reference numerals S5, T5, U5, V5, and W5 indicate dimensions of the support member 19, and S6, T6, U6, V6, and W6 indicate dimensions of the support member 20, respectively.

As described above, S6, T6, U6, V6, and W6 determine the dimensions of the support member 20 so that the portion withstands the threshold external force. By contrast, S5, T5, U5, V5, and W5 determine the dimensions so that the strength of the support member 19 becomes higher. In FIG. 8, S5 and S6, T5 and T6, U5 and U6, and V5 and V6 are substantially equal to each other, respectively, and W5 is larger than W6. In the support member 19, the width W6 of the U-like support member is increased to enhance the strength of the support member.

Figure 9:
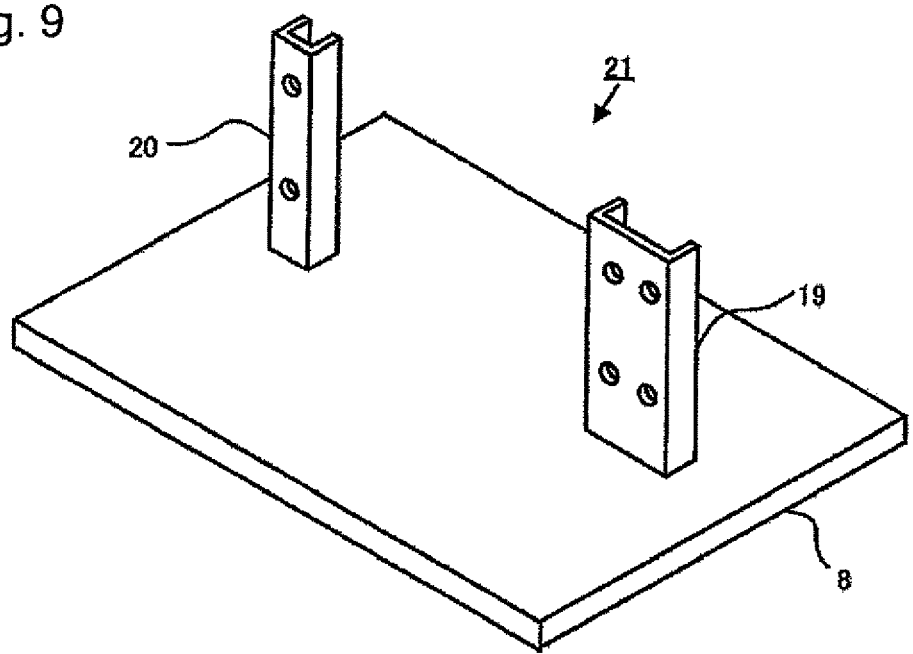
FIG. 9 is an exemplary perspective view schematically showing a stand in the third embodiment.

FIG. 9 is a perspective view schematically showing a stand 21 in the third embodiment. The stand 21 is configured by the pedestal 8 and the support members 19, 20. When the number of the support members is two, the strengths of the two support members are made different from each other. When the strengths are different from each other, there is a large possibility that the support member having the lower strength is first deformed, and at least the possibility that the support members are simultaneously deformed is low. In one and other sides across the vertical center axis 28 (see FIG. 2) which laterally bisects the body 2, the strengths of the support members are made different from each other. The support member having the lower strength is first deformed, and the support member having the higher strength is not deformed or lately deformed. At least the situation where the support members are simultaneously broken does not occur, and hence there is a large possibility that the body 2 can be prevented from being collapsed.

Fourth Embodiment

Figure 10:
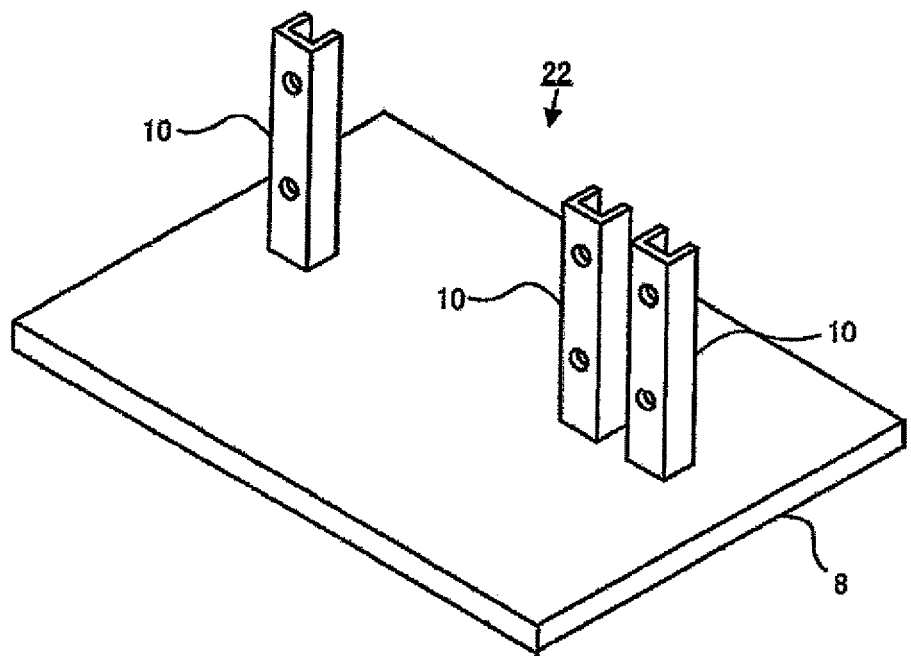
FIG. 10 is an exemplary perspective view schematically showing a stand in a fourth embodiment.

FIG. 10 is a perspective view schematically showing a stand 22 in the fourth embodiment of the invention. The fourth embodiment is different from the first embodiment in that two support members 10 are disposed in the fourth embodiment in place of the support member 9 in the first embodiment. Since the two support members 10 are disposed, the strength can be doubled.

In FIG. 10, the three support members 10 have the same strength, and the support members 10 are arranged so as to be asymmetrical with respect to the center axis 28 which serves as the symmetrical axis, whereby the strengths are differentiated. In order that the strengths of the support members in the one and other sides across the vertical center axis 28 (see FIG. 2) which laterally bisects the body 2 are made different, at least one of the plurality of support members may be made different in strength from the other support members.

Fifth Embodiment

Figure 11:
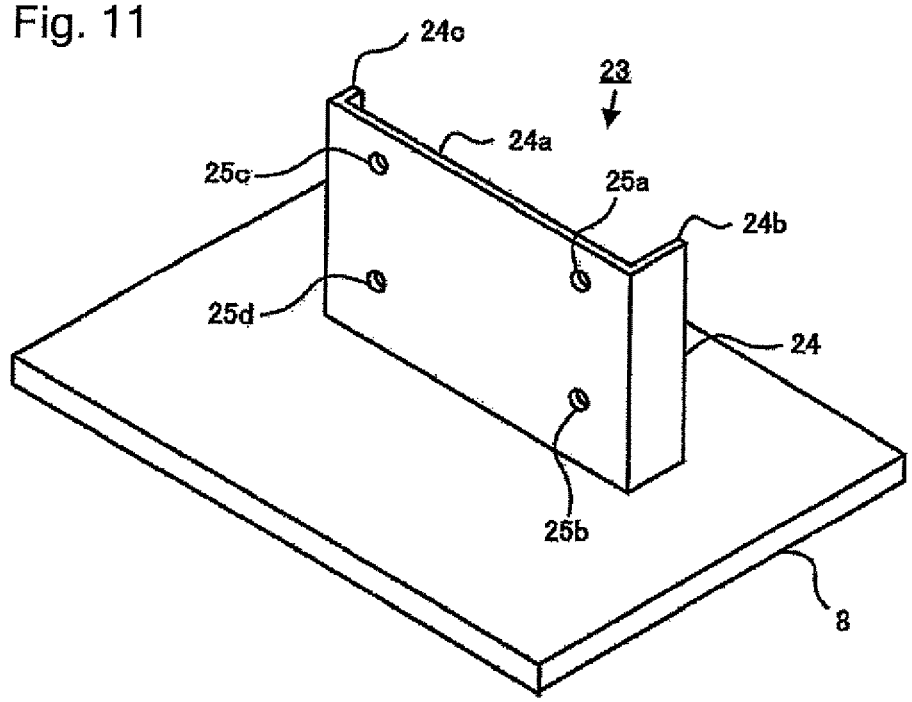
FIG. 11 is an exemplary perspective view schematically showing a stand in a fifth embodiment.

FIG. 11 is a perspective view schematically showing a stand 23 in the fifth embodiment of the invention. The fifth embodiment is different from the first embodiment in that a support plate 24 is disposed in place of the support members 9, 10 in the first embodiment. The stand 23 is configured by the pedestal 8 and the support plate 24. The support plate 24 is positioned above the pedestal 8, and disposed substantially perpendicularly to the planar portion of the pedestal 8. Particularly, the faces to which the chassis 5 is to be joined are substantially vertical. Four screw-fixing holes 25a, 25b, 25c, 25d are formed in the support plate 24. The number of the screw-fixing holes is adequately increased in accordance with that of required screws.

The support plate 24 includes rib portions 24b, 24c in the both sides of the support plate body 24a. The sizes of the support plate body 24a and the rib portions are determined so that the plate withstands the threshold external force. In one of the rib portions, the rib is lengthened in order to enhance the strength. In FIG. 11, the size of the rib portion 24c of the support plate 24 is determined so that the portion withstands the threshold external force, and the rib portion 24b is lengthened so that the strength is enhanced. A method may be employed in which, in place of changing the sizes of the rib portions, the thickness of the support plate body 24a of the support plate 24 is changed.

Sixth Embodiment

Figure 12:
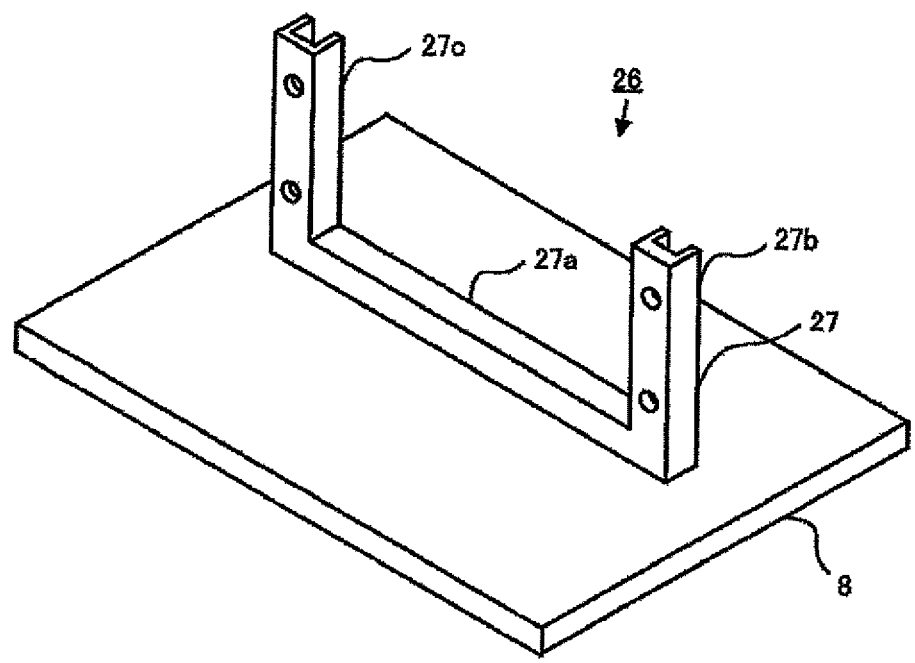
FIG. 12 is an exemplary perspective view schematically showing a stand in a sixth embodiment.
Figure 13:
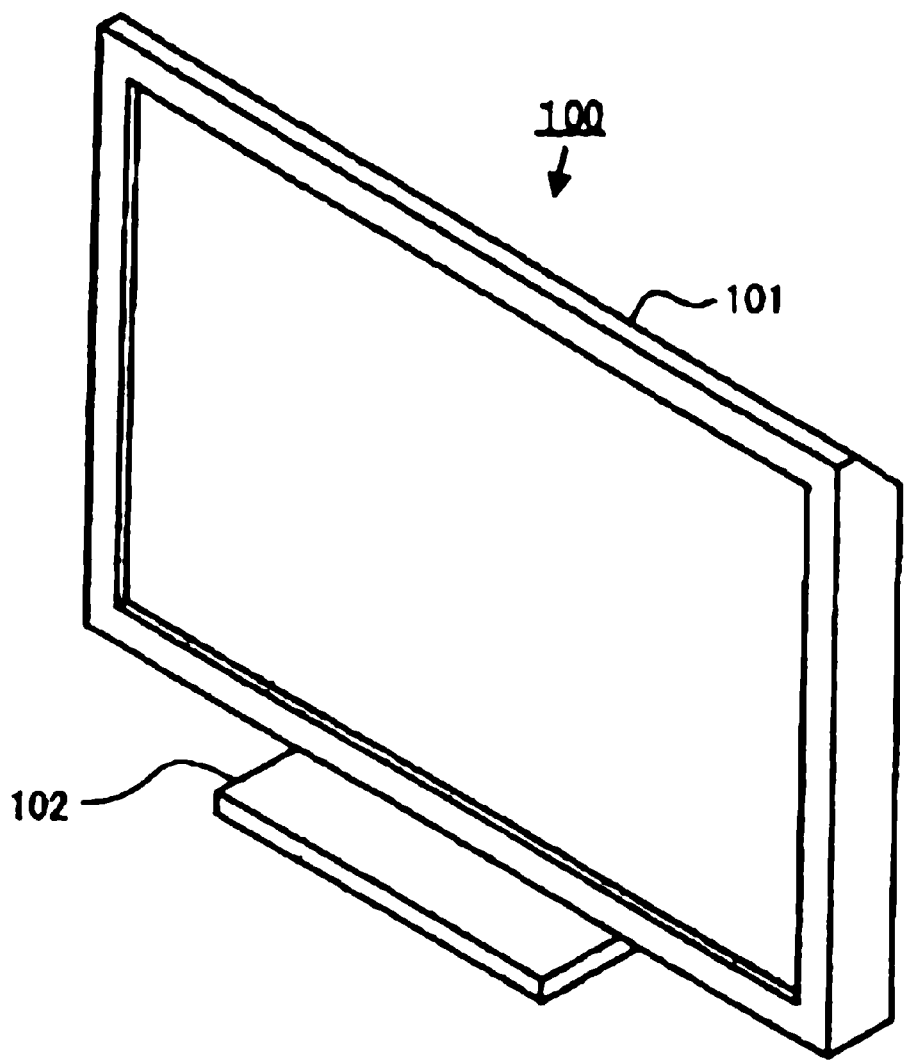
FIG. 13 is an exemplary perspective view showing the external shape of a display apparatus.
Figure 14:
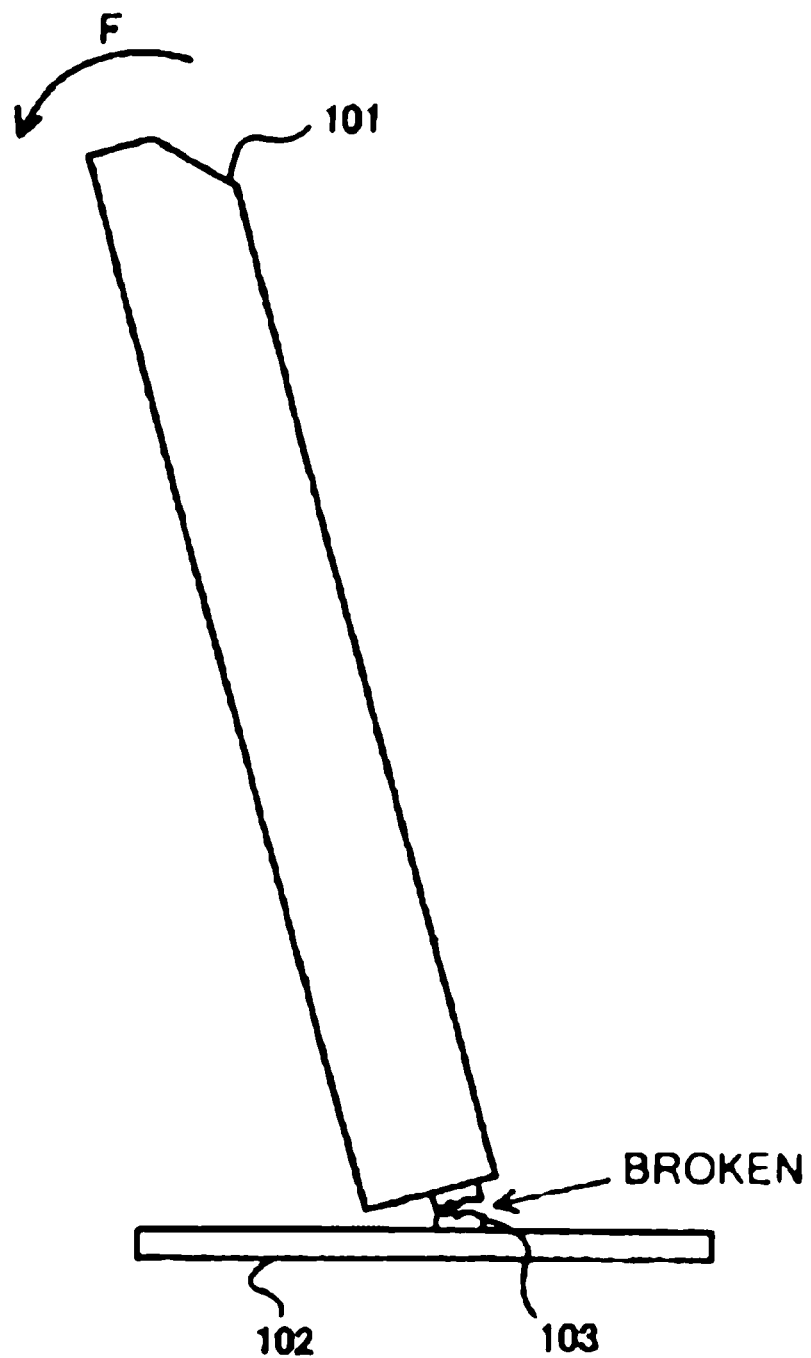
FIG. 14 is an exemplary view of a state where the body of the display apparatus is collapsed, as viewed from the side.

FIG. 12 is a perspective view schematically showing a stand 26 in the sixth embodiment of the invention. The sixth embodiment is different from the first embodiment in that a support member 27 having a U-like shape is disposed in place of the support members 9, 10 in the first embodiment. In the support member 27, a connecting portion 27a, and support members 27b, 27c are integrally molded by aluminum die casting or the like. The connecting portion 27a is coupled to the pedestal 8 by screws or the like. The support members 27b, 27c correspond to the support members 9, 10 in the first embodiment, respectively. The section of the support member 27b is identical with section (b) of FIG. 6, and that of the support member 27c is identical with section (a) of FIG. 6.

As described above, in the first to sixth embodiments, in the one and other sides across the vertical center axis 28 (see FIG. 2) laterally bisects the body 2, the strengths of the support members are made different from each other. According to the configuration, when an external or impact force which exceeds the threshold external force acts on the body 2, the support member having the lower strength is first deformed. When the support member having the lower strength is first deformed or broken, the external or impact force is absorbed, and the support member having the higher strength is not broken, so that it is possible to prevent the body 2 from being collapsed. At least the situation where the support members are simultaneously broken does not occur, and hence the body 2 can be prevented from being collapsed, whereby danger due to collapsing of the body 2 can be prevented from occurring.

The invention is not restricted to above-described configurations, and may be variously modified.

What is claimed is:

1. A display apparatus comprising:
a body having a display panel, and a chassis placed on a back of the display panel; and
a stand having a plurality of support members that support the body by coupling to the body and a pedestal, wherein
the plurality of support members include a first support member having a first strength that withstands a threshold external force and a second support member having a second strength greater than the first strength, by differing horizontal sectional shapes of the first support member and the second support member,
the pedestal and the respective first and second support members are integrated with one another,
the first support member independently supports the body at a first position on the pedestal, and
the second support member supports the body at a second position which is separated from the first position on the pedestal.

2. The display apparatus according to claim 1, wherein a sectional area of the first support member is different from a sectional area of the second support member.

3. The display apparatus according to claim 1, wherein a sectional area of the first support member is smaller than a sectional area of the second support member.

4. A display apparatus comprising:
a display panel including a display screen;
a chassis placed on an opposite side of the display screen of the display panel;
at least one cover accommodating the display panel and fixed to the chassis; and
a stand that supports the cover by connecting with the chassis and includes a first support member, a second support member and a pedestal, wherein
a horizontal sectional shape of the first support member is different from a sectional shape of the second support member,
the second support member has a higher strength to withstand an external force than a strength of the first support member,
the pedestal and the respective first and second support members are integrated with one another,
the first support member independently supports the cover at a first position on the pedestal, and
the second support member supports the cover at a second position which is separated from the first position on the pedestal.

5. The display apparatus according to claim 4, wherein a sectional area of the first support member is different from a sectional area of the second support member.

6. The display apparatus according to claim 5, wherein the sectional area of the first support member is smaller than the sectional area of the second support member.

7. A display apparatus comprising:
a body that comprises a display panel including a display screen and a chassis placed on a side of the display panel opposite the display screen;
at least one cover accommodating the display panel; and
a stand coupled to the body, the stand including a first support member and, a second support member, and a pedestal, the first support member having a horizontal sectional shape and the second support member having a horizontal sectional shape different than the first support member and the second support member having a higher strength for withstanding external forces than a strength of the first support member, wherein
the pedestal and the respective first and second support members are integrated with one another,
the first support member independently supports the body at a first position on the pedestal, and
the second support member supports the body at a second position which is separated from the first position on the pedestal.

8. The display apparatus according to claim 7, wherein a sectional area of the horizontal sectional shape of the first support member is smaller than a sectional area of the horizontal sectional shape of the second support member.

* * * * *